(12) United States Patent
Chen et al.

(10) Patent No.: US 12,400,883 B2
(45) Date of Patent: Aug. 26, 2025

(54) STRUCTURE OF TRANSFERRING DIES FOR USE IN MASS TRANSFERRING PROCESS

(71) Applicant: Vanguard International Semiconductor Corporation, Hsinchu (TW)

(72) Inventors: Yung-Hsiang Chen, Hsinchu (TW); Yun-Chou Wei, Taipei (TW); Ke-Fang Hsu, Hsinchu County (TW); Ching-Yi Hsu, Hsinchu (TW); Yen-Shih Ho, Taoyuan (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 673 days.

(21) Appl. No.: 17/701,686

(22) Filed: Mar. 23, 2022

(65) Prior Publication Data

US 2023/0307268 A1    Sep. 28, 2023

(51) Int. Cl.
*H01L 21/67* (2006.01)
*H01L 23/00* (2006.01)

(52) U.S. Cl.
CPC ........ *H01L 21/67132* (2013.01); *H01L 24/16* (2013.01); *H01L 24/81* (2013.01); *H01L 2224/16225* (2013.01); *H01L 2224/81007* (2013.01); *H01L 2224/81805* (2013.01)

(58) Field of Classification Search
CPC ... H01L 21/67132; H01L 24/16; H01L 24/81; H01L 2224/16225; H01L 2224/81007; H01L 2224/81805

USPC ........................................................ 257/738
See application file for complete search history.

(56) References Cited

U.S. PATENT DOCUMENTS

| | | | | |
|---|---|---|---|---|
| 2016/0336488 | A1* | 11/2016 | Bower | ................ H01L 33/44 |
| 2018/0204973 | A1* | 7/2018 | Jeung | .............. H01L 33/0093 |
| 2018/0350783 | A1* | 12/2018 | Yoo | ....................... H01L 33/36 |
| 2019/0051552 | A1* | 2/2019 | Bower | ............... H01L 21/6835 |
| 2019/0109124 | A1 | 4/2019 | Lin | |
| 2020/0403114 | A1* | 12/2020 | Meng | ................. H01L 21/6835 |
| 2021/0336114 | A1 | 10/2021 | Bower | |
| 2022/0181185 | A1* | 6/2022 | Loi | ...................... H01L 21/6835 |
| 2022/0302349 | A1* | 9/2022 | Kuo | ....................... H01L 33/486 |

* cited by examiner

*Primary Examiner* — Norman D Richards
*Assistant Examiner* — Laura M Dykes
(74) *Attorney, Agent, or Firm* — Winston Hsu (57) ABSTRACT

A structure of transferring dies includes an oxide layer supporting feature, multiple dies, a bonding feature, a supporting wafer, and a spacer. The oxide layer supporting feature includes multiple repeating units. Each repeating unit has a die setting region and a peripheral region. The die setting region of one repeating unit is separated from the peripheral region of another adjacent repeating unit. The die is disposed on the die setting region and the bonding feature is disposed on the peripheral region of the oxide layer supporting feature. The supporting wafer is disposed under the oxide layer supporting feature and separated from the die and the bonding feature by a gap. The spacer is disposed between the bonding feature and the supporting wafer, and bonded to the bonding feature.

7 Claims, 9 Drawing Sheets

STRUCTURE OF TRANSFERRING DIES FOR USE IN MASS TRANSFERRING PROCESS

BACKGROUND OF THE INVENTION

1. Field of the Invention

The present disclosure relates generally to the technology of mass transfer of dies, and more particularly to structures and methods of transferring dies used in the process of mass transferring dies, and die bonded structures after the dies are transferred.

2. Description of the Prior Art

As the development of technology, dies have been widely used in various electronic devices. A mass transfer method is usually used to place a large number of dies on the substrate of an electronic device for subsequent assembly. The method of placing the dies on the substrate of the electronic device is, for example, surface mount technology (SMT), wafer-to-wafer transfer technology, electrostatic transfer technology, elastomer stamp micro-transfer-printing technology, etc., where the elastomer stamp micro-transfer-printing technology uses an elastomer stamp as a pick-up head, fine-tunes the speed and force of the pick-up head, and destroys a tether structure of the component to achieve the action of picking up the dies, which can transfer a large number of dies to the substrate of the electronic device.

The tether structure of the component needs to be connected to a suspended die. Generally, the die is suspended by removing the material layer under the die through an etching process. However, the etching process is not easy to be controlled, and there may be some problems of insufficient etching or excessive etching to cause the efficiency of mass transfer of dies to be lower, and the number, the size, and the arrangement of transferred dies are limited.

SUMMARY OF THE INVENTION

In view of this, embodiments of the present disclosure provide improved structures and methods of transferring dies to enhance the efficiency of transferring dies, increase the number of transferred dies per unit area, and improve the tolerance of the size and the arrangement of the dies.

According to one embodiment of the present disclosure, a structure of transferring dies is provided and includes an oxide layer supporting feature, a plurality of dies, a bonding feature, a supporting wafer, and a spacer. The oxide layer supporting feature includes a plurality of repeating units, where each of the repeating units includes a die setting region and a peripheral region, and the die setting region of one repeating unit is separated from the peripheral region of another adjacent repeating unit. The dies are disposed on the die setting regions of the oxide layer supporting feature. The bonding feature is disposed on the peripheral region of the oxide layer supporting feature. The supporting wafer is disposed under the oxide layer supporting feature and separated from the die and the bonding feature by a gap. The spacer is disposed between the bonding feature and the supporting wafer, where the spacer is bonded to the bonding feature.

According to one embodiment of the present disclosure, a method of transferring dies is provided and includes the following steps. A semiconductor-on-insulator (SOI) substrate is provided and includes a semiconductor substrate, an oxide layer and a semiconductor layer, where the oxide layer is disposed between the semiconductor substrate and the semiconductor layer. A plurality of dies and a bonding feature are formed on the oxide layer, where the bonding feature is separated from the dies, the die is disposed on a die setting region of a repeating unit of the oxide layer, and the bonding feature is disposed on a peripheral region of the repeating unit of the oxide layer. A supporting wafer is provided and a spacer is formed on the supporting wafer. A bonding process is performed to bond the supporting wafer to the bonding feature through the spacer, where the supporting wafer is separated from the die and the bonding feature by a gap. An etching process is performed on the oxide layer to separate the die setting region of one repeating unit from the peripheral region of another adjacent repeating unit of the oxide layer. In addition, the semiconductor substrate of the SOI substrate is removed to expose the oxide layer after the bonding process.

According to one embodiment of the present disclosure, a die bonded structure is provided and includes a carrier substrate, a plurality of dies, a solder feature, and an oxide layer. The dies are bonded on the carrier substrate. The die has a first surface and a second surface opposite to the first surface, where the second surface is away from the carrier substrate. The solder feature is disposed between the first surface of the die and the carrier substrate. The oxide layer is disposed on the second surface of the die, where a portion of the oxide layer laterally protrudes from the die.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features may not be drawn to scale. In fact, the dimensions of the various features may be arbitrarily increased or reduced for clarity of discussion.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "under", "on", "over", "above", "upper", "bottom", "top" and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. For example, if the device in the figures is turned over, elements described as "below" and/or "under" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first", "second", and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that may vary as desired.

Although the disclosure is described with respect to specific embodiments, the principles of the invention, as defined by the claims appended herein, can obviously be applied beyond the specifically described embodiments of the invention described herein. Moreover, in the description of the present disclosure, certain details have been left out in order to not obscure the inventive aspects of the disclosure. The details left out are within the knowledge of a person having ordinary skill in the art.

The present disclosure is directed to structures and methods for mass transfer (or referred to as mega transfer) of dies, where an oxide layer in a semiconductor-on-insulator (SOI) substrate is used to form a tether structure with anchor in the structure of transferring dies. According to embodiments of the present disclosure, while forming the tether structure with anchor for transferring dies, it is not necessary to etch the material layer under the dies, such that there is no problem of insufficient etching or excessive etching. Meanwhile, the tolerance of the size and the arrangement of the transferred dies are improved, thereby increasing the number of transferred dies per unit area, and improving the efficiency of transferring dies. In addition, according to embodiments of the present disclosure, in a die bonded structure after the dies are transferred, there is an oxide layer on the backside of the die, which protects the die and provides the support for the die with reduced thickness, thereby increasing the mechanical strength of the die bonded structure.

Figure 1:
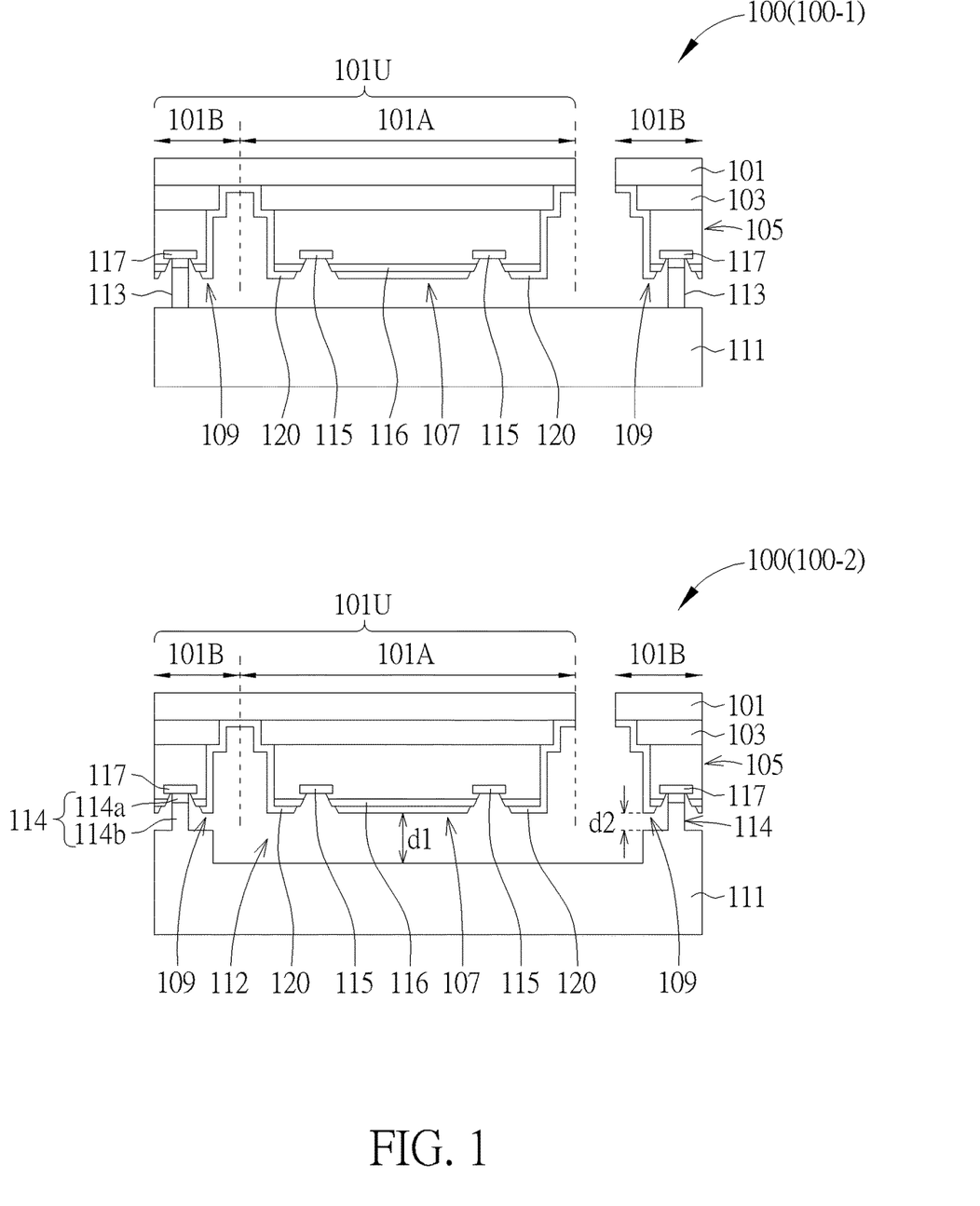
FIG. 1 shows schematic cross-sectional diagrams of two structures of transferring dies having different spacers and different supporting wafers according to some embodiments of the present disclosure.

FIG. 1 shows schematic cross-sectional diagrams of two structures of transferring dies according to some embodiments of the present disclosure, where structures 100-1 and 100-2 have different spacers and different supporting wafers. Please refer to the structure 100-1 of FIG. 1, which is a schematic cross-sectional diagram of a structure 100 of transferring dies according to one embodiment of the present disclosure. The structure 100 of transferring dies an intermediate structure used in the process of mass transfer of dies. In order to make the diagrams are concise and easy to understand, all the cross-sectional diagrams show one die. In fact, the number of dies to be transferred may be in the thousands or millions. The transferred dies may be applied to for example, micro light emitting diode (μ-LED) display devices as driving chips for μ-LED, but not limited thereto. As shown in the structure 100-1 of FIG. 1, according to one embodiment of the present disclosure, the structure 100-1 of transferring dies includes an oxide layer supporting feature 101 that has a plurality of repeating units 101U. Each repeating unit 101U has a die setting region 101A and a peripheral region 101B, and the die setting region 101A of one repeating unit 101U is separated from the peripheral region 101B of another adjacent repeating unit. For each repeating unit 101U, a tether structure like a tether state is disposed at the interface between the die setting region 101A and the peripheral region 101B. Through the tether structure, the die setting region 101A is connected to the peripheral region 101B. A plurality of dies 107 is respectively disposed on the die setting regions 101A of the oxide layer supporting feature 101, and a bonding feature 109 is disposed on the peripheral region 101B of the oxide layer supporting feature 101. According to embodiments of the present disclosure, the oxide layer supporting feature 101 may be formed from a buried oxide layer in a semiconductor-on-insulator (SOI) substrate, and the material of the oxide layer supporting feature 101 is, for example silicon oxide. Both the die 107 and the bonding feature 109 may be formed from a semiconductor layer 103 and an interconnect structure layer 105 on the semiconductor layer 103 of the SOI substrate, such that the die 107 and the bonding feature 109 have substantially the same semiconductor layer 103 and the same interconnect structure layer 105, and the die 107 and the bonding feature 109 are separated from each other. The semiconductor layer 103 includes silicon, polysilicon or other semiconductor materials. The interconnect structure layer 105 includes multiple dielectric layers and multiple conductive layers. The interconnect structure layer 105 is electrically connected to various elements in the semiconductor layer 103. According to an embodiment of the present disclosure, dummy elements are disposed in the semiconductor layer 103 of the bonding feature 109, and dummy interconnections are disposed in the interconnect structure layer 105 of the bonding feature 109.

In one embodiment, the die 107 has a plurality of conductive pads 115, and the bonding feature 109 also has a bonding pad 117. A passivation layer 116 may be disposed on the surfaces of the die 107 and the bonding feature 109. The passivation layer 116 has multiple openings to expose the conductive pads 115 of the die 107 and the bonding pad 117 of the bonding feature 109. In addition, the structure 100-1 of transferring dies further includes a protective layer 120 that conformally covers the sides and the front surface of the die 107, the sides and the front surface of the bonding feature 109, and the exposed surface of the oxide layer supporting feature 101 between the die 107 and the bonding features 109. The protective layer 120 has a plurality of openings that respectively expose the conductive pads 115 of the die 107 and the bonding pad 117 of the bonding feature 109. In some embodiments, the material of the protective layer 120 includes silicon oxide, silicon nitride, silicon oxynitride, a combination thereof, or other insulating materials. According to an embodiment of the present disclosure, the thickness of the oxide layer supporting feature 101 in the die setting region 101A is between about 2 μm and about 4 μm (referred to as a first thickness). The sum of the thickness of the oxide layer supporting feature 101 in the die setting region 101A and the thicknesses of the die 107 is less than about 15 μm (referred to as a second thickness). Thus, the ratio of the first thickness to the second thickness is between 0.2 and 1.0.

As shown in FIG. 1, according to an embodiment of the present disclosure, the structure 100-1 of transferring dies further includes a supporting wafer 111 disposed under the oxide layer supporting feature 101, where the supporting wafer 111 is separated from the die 107 and the bonding feature 109 by a gap. In addition, the structure 100-1 of transferring dies further includes a spacer 113 disposed between the bonding feature 109 and the supporting wafer 111, where the spacer 113 is bonded to the bonding pad 117 of the bonding feature 109. In this embodiment, the spacer 113 includes a glue bond dam to perform bonding through adhesive force.

According to embodiments of the present disclosure, during the process of transferring dies, the oxide layer supporting feature 101 in the structure 100-1 of transferring dies supports the die 107 and the bonding feature 109 that are separated from each other, and after a die transfer equipment is attached to the oxide layer supporting feature 101, a portion of the oxide layer supporting feature 101 between the die 107 and the bonding feature 109 is used as a tether structure. When the die transfer equipment applies torsion force on the oxide layer supporting feature 101, the portion of the oxide layer supporting feature 101 as the tether structure will be broken to make the die 107 to be released from the structure 100-1 of transferring dies, and then the die 107 is transferred and bonded onto a carrier substrate of an electronic device. In addition, the spacer 113 in the structure 100-1 of transferring dies keeps a gap between the die 107 and the supporting wafer 111 to prevent the die 107 from being damaged by collision during the process of transferring dies. In addition, the supporting wafer 111 provides more support to the die 107 having a reduced thickness during the process of transferring dies, thereby strengthening the overall mechanical strength of the structure 100-1 of transferring dies.

Please refer to the structure 100-2 of FIG. 1, which is a schematic cross-sectional diagram of a structure 100 of transferring dies according to another embodiment of the present disclosure. The difference between the structure 100-2 and the structure 100-1 of FIG. 1 is that the supporting wafer 111 of the structure 100-2 of transferring dies has a cavity 112 corresponding to the position of the die 107, and the distance d1 between the die 107 and the bottom surface of the cavity 112 of the supporting wafer 111 is greater than the distance d2 between the bonding feature 109 and the surface of the supporting wafer 111. In addition, a spacer 114 of the structure 100-2 of transferring dies includes a eutectic bond bump 114a and a stand-off 114b, where the stand-off 114b may be formed by etching a portion of the supporting wafer 111, i.e., the stand-off 114b and the supporting wafer 111 may be integrally formed. In this embodiment, bonding is performed by using the eutectic bond bump 114a to produce eutectic bonding with the bonding pad 117 of the bonding feature 109. The other components of the structure 100-2 of transferring dies may refer to the aforementioned descriptions of the structure 100-1, and will not be repeated here.

Figure 2:
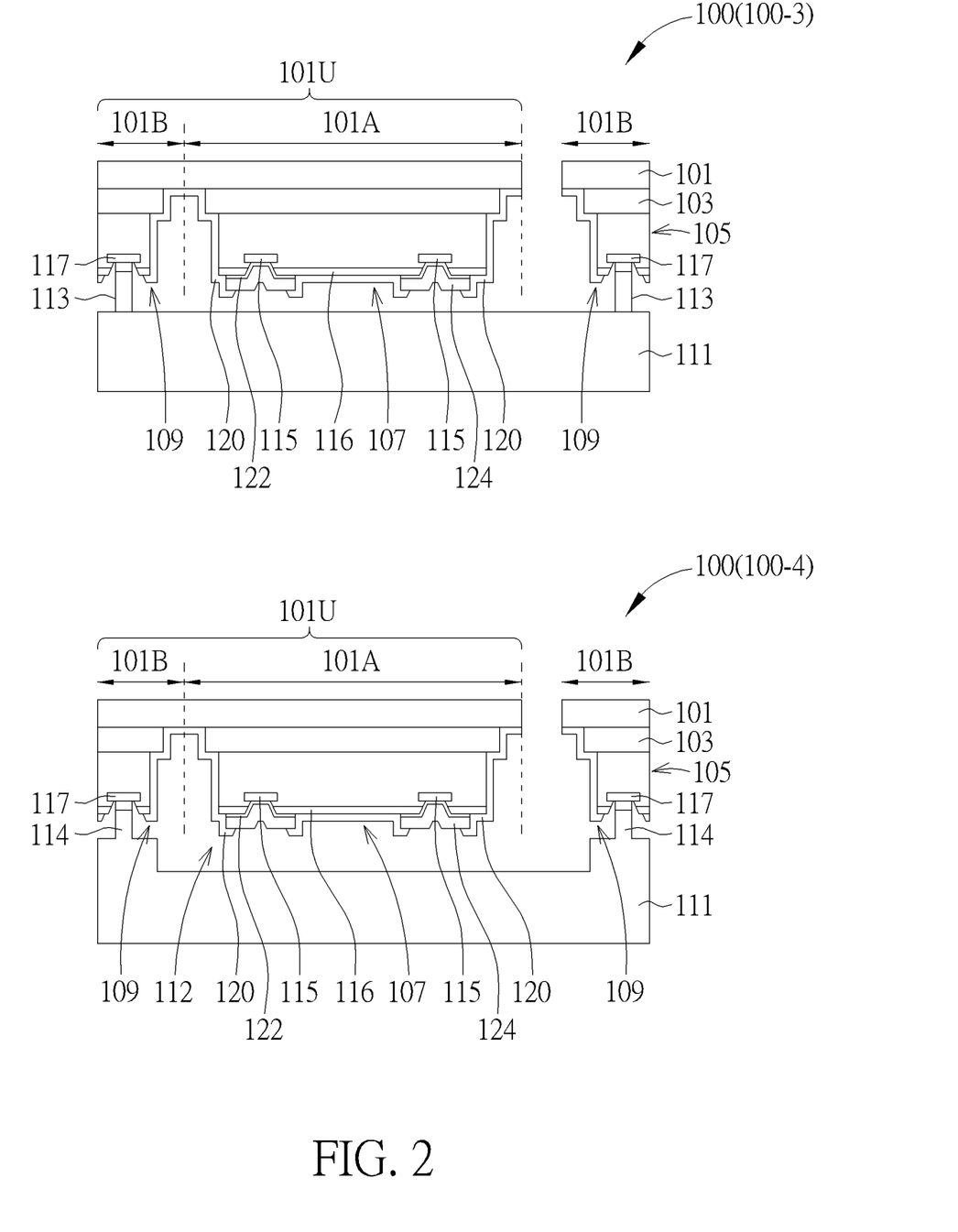
FIG. 2 shows schematic cross-sectional diagrams of two structures of transferring dies having different spacers and different supporting wafers according to some other embodiments of the present disclosure.

FIG. 2 shows schematic cross-sectional diagrams of two structures of transferring dies according to some other embodiments of the present disclosure, where structures 100-3 and 100-4 of transferring dies have different spacers and different supporting wafers. A spacer 113 and a supporting wafer 111 in the structure 100-3 of transferring dies of FIG. 2 may refer to the aforementioned description of the structure 100-1 of FIG. 1, and will not be repeated here. A space 114 and a supporting wafer 111 having a cavity 112 in the structure 100-4 of transferring dies of FIG. 2 may refer to the aforementioned description of the structure 100-2 of FIG. 1, and will not be repeated here. The difference between the embodiments of FIG. 2 and the embodiments of FIG. 1 is that in the structures 100-3 and 100-4 of transferring dies of FIG. 2, an under bump metallurgy (UBM) 122 and a metal bump 124 are further disposed on the conductive pad 115 of the die 107. The UBM 122 is conformally formed on the surface of the conductive pad 115 exposed by the opening of the passivation layer 116, on the sidewalls of the opening of the passivation layer 116, and on a portion of the surface of the passivation layer 116. The metal bump 124 is disposed on the UBM 122. The metal bump 124 fills up the opening of the passivation layer 116 and extends to a portion of the surface of the passivation layer 116. In addition, in the embodiments of FIG. 2, the protective layer 120 further covers the sidewalls of the UBM 122 and the metal bump 124, and also extend to a portion of the surface of the metal bump 124. The opening of the protective layer 120 exposes another portion of the surface of the metal bump 124.

Figure 3:
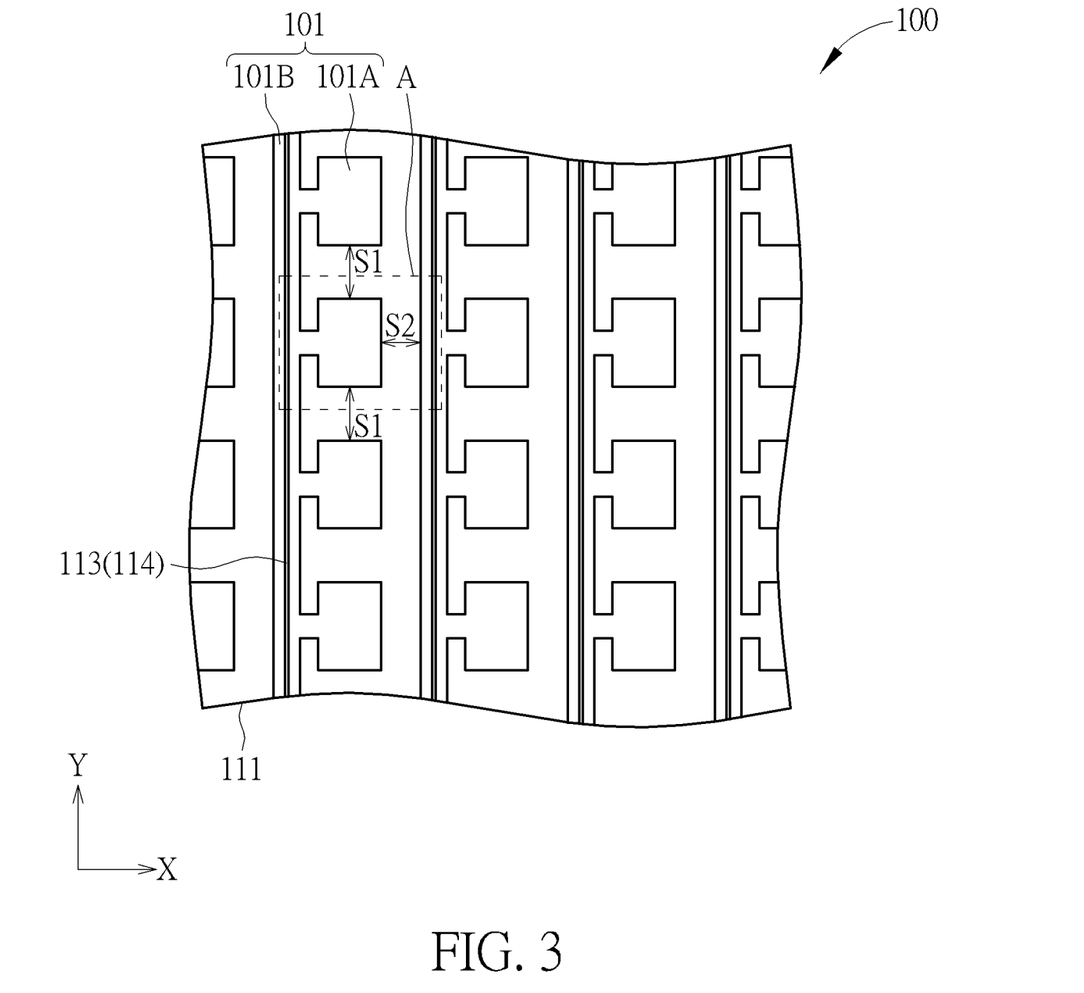
FIG. 3 is a top view of a structure of transferring dies according to some embodiments of the present disclosure.

FIG. 3 is a top view of a structure of transferring dies according to some embodiments of the present disclosure, where the area A corresponds to the structures of FIG. 1 and FIG. 2. In order to make the diagram concise and easy to understand, FIG. 3 only depicts the oxide layer supporting feature 101, the spacer 113/114, and the supporting wafer 111. As shown in FIG. 3, in some embodiments, the width (e.g., in the Y direction) of the oxide layer supporting feature 101 at the interface between the die setting region 101A and the peripheral region 101B is narrowed, such that the oxide layer supporting feature 101 is used as a tether structure for transferring dies. When the die transfer equipment applies a torsion force on the oxide layer supporting feature 101, the narrowed portion will be broken, so that the die is released from the structure 100 of transferring dies. In some embodiments, the spacer 113/114 may be an elongated structure disposed corresponding to the peripheral region 101B. In other embodiments, two adjacent spacers 113/114 may also construct a portion of a ring structure. In addition, the die setting region 101A of the oxide layer supporting feature 101 may correspond to the position of placing the die.

According to embodiments of the present disclosure, since the tether structure with an anchor for transferring dies is provided by the oxide layer supporting feature 101, and the supporting wafer 111, the spacer 113/114 and the bonding feature 109 make the die 107 to be suspended, the dies are transferred without etching the material layer under the dies 107. Therefore, the size of the die, the layout density of the dies, the distance between the dies (such as the distance S1 between the die setting regions 101A as shown in FIG. 3), and the distance S2 between the die setting region 101A of one repeating unit and the peripheral region 101B of another adjacent repeating unit (such as the distance S2 as shown in FIG. 3) are not limited by an etching process. The aforementioned distances S1 and S2 may be reduced, and the layout density of the dies may be increased, so that the number of transferred dies per unit area is increased, and the efficiency of transferring dies is improved.

Figure 4:
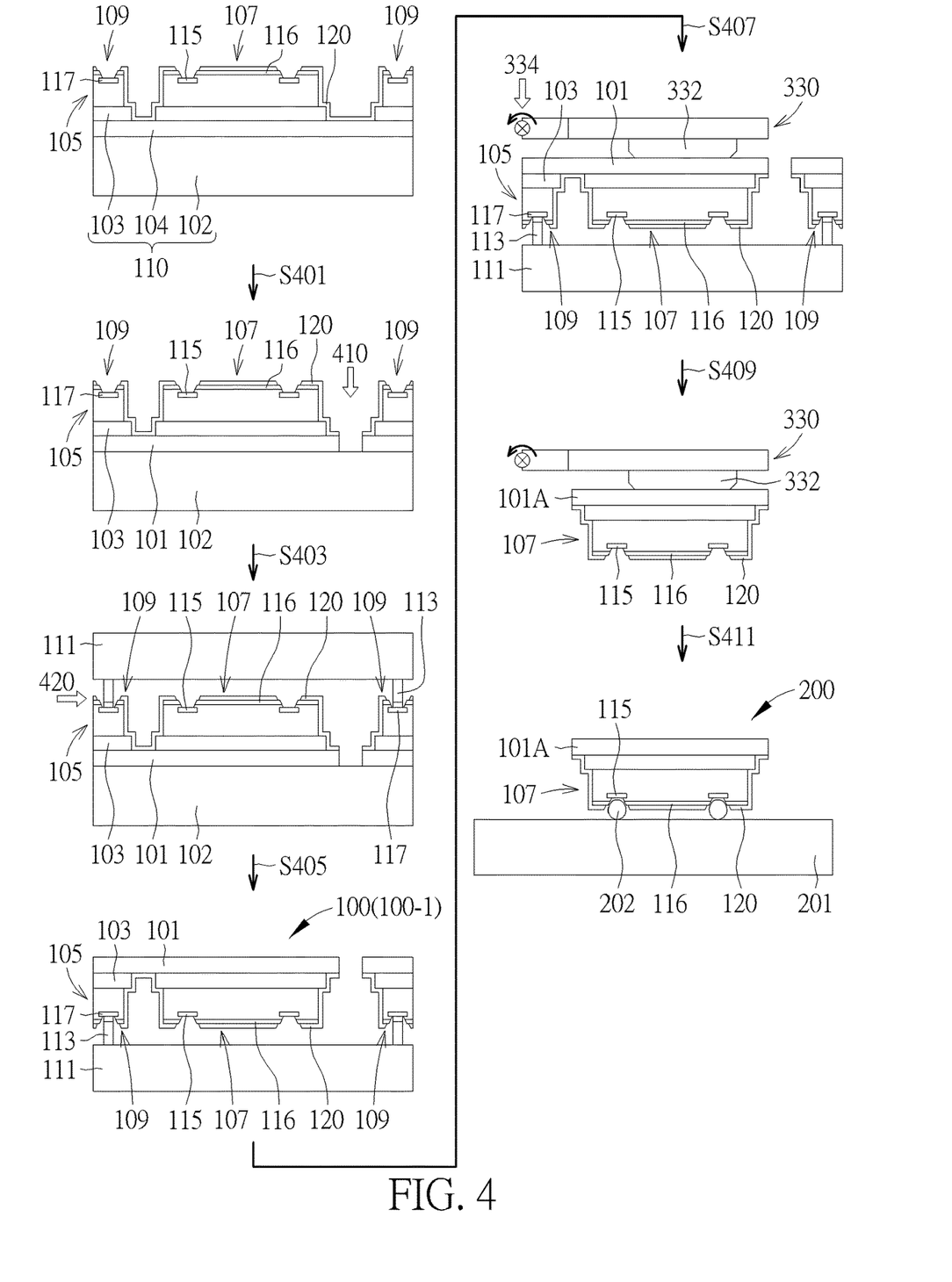
FIG. 4 shows schematic cross-sectional diagrams of structures at several stages of a method of transferring dies and a die bonded structure after the dies are transferred according to one embodiment of the present disclosure.

FIG. 4 shows schematic cross-sectional diagrams of structures at several stages of a method of transferring dies and a die bonded structure after the dies are transferred according to one embodiment of the present disclosure. As shown in FIG. 4, in one embodiment, first, a SOI substrate 110 is provided. The SOI substrate 110 includes a semiconductor substrate 102, an oxide layer 104 and a semiconductor layer 103, where the oxide layer 104 is disposed between the semiconductor substrate 102 and the semiconductor layer 103. A plurality of electronic devices such as transistors, resistors, capacitors, etc. are formed in the semiconductor layer 103, and an interconnection structure layer 105 is formed on the semiconductor layer 103. The conductive pads 115 of the die 107 and the bonding pad 117 of the bonding feature 109 may be formed from the topmost conductive layer of the interconnect structure layer 105. The passivation layer 116 is formed on the interconnect structure layer 105, and has a plurality of openings to respectively expose the conductive pads 115 and the bonding pad 117. Next, a patterning process is performed on the interconnect structure layer 105 and the semiconductor layer 103 to form a plurality of dies 107 and bonding features 109 on the oxide layer 104, where the bonding feature 109 is separated from the die 107, which may refer to the aforementioned description of FIG. 1. The die 107 is disposed on the die setting region 101A of the repeating unit of the oxide layer 104, and the bonding feature 109 is disposed on the peripheral region 101B of the repeating unit of the oxide layer 104. Then, a protective layer 120 is deposited to conformally cover the sides and the front surface of the die 107, the sides and the front surface of the bonding feature 109, and the exposed surface of the oxide layer 104 between the die 107 and the bonding feature 109. The protective layer 120 is etched to form a plurality of openings to respectively expose the conductive pads 115 of the die 107 and the bonding pad 117 of the bonding feature 109.

Next, as shown in FIG. 4, at step S401, an etching process 410 is performed on the protective layer 120 and the oxide layer 104, so that the protective layer 120 and the oxide layer 104 in the die setting region 101A of one repeating unit are separated from the protective layer 120 and the oxide layer 104 in the peripheral region 101B of another adjacent repeating unit, and an oxide layer supporting feature 101 is formed.

Then, as shown in FIG. 4, at step S403, a supporting wafer 111 is provided, and spacers 113 are formed on the supporting wafer 111. A bonding process 420 is performed to bond the supporting wafer 111 to the bonding pads 117 of the bonding features 109 through the spacers 113, where the supporting wafer 111 is separated from the die 107 and the bonding features 109 by a gap. In this embodiment, the bonding process 420 may be performed through the glue of the spacer 113.

Afterwards, as shown in FIG. 4, at step S405, the structure of the step S403 is turned upside down, and the semiconductor substrate 102 of the SOI substrate 110 may be completely removed to expose the oxide layer supporting feature 101, and the structure 100-1 of transferring dies as shown in the FIG. 1 is formed.

Next, as shown in FIG. 4, at step S407, a die transfer equipment (hereinafter may be referred to as a transfer equipment) 330 is provided, which is temporarily fixed on the die setting region 101A of the oxide layer supporting feature 101 through an attachment feature 332. In some embodiments, the attachment feature 332 includes an adhesive, an UV-curable tape, an adhesive fixture using Van der Waals force (such as an adhesive stamp), or a mechanical clamp, so that the transfer equipment 330 adheres or adsorbs on the oxide layer supporting feature 101, or the transfer equipment 330 may directly clamp the die 107 and the oxide layer supporting feature 101 by using the mechanical clamp.

Then, as shown in FIG. 4, still at the step S407, a torsion force 334 is applied by the transfer equipment 330 to fracture the tether structure of the oxide layer supporting feature 101 at the interface between the die setting region 101A and the peripheral region 101B in the same repeating unit, so that the die setting region 101A and the peripheral region 101B of the same repeating unit are separated from each other. As a result, at step S409, the die 107 is released from the structure 100-1 of transferring dies, and a portion of the oxide layer supporting feature 101 (such as the die setting region 101A) is remained on the die 107 and attached to the transfer equipment 330.

Thereafter, as shown in FIG. 4, at step S411, the plurality of dies 107 and the portion of the oxide layer supporting feature 101 (such as the die setting region 101A) remained on the backside surface of the die 107 are transferred by the transfer equipment 330 onto a carrier substrate 201. After the plurality of dies 107 are transferred onto the carrier substrate 201, the transfer equipment 330 and the attachment feature 332 are detached from the remained portion of the oxide layer supporting feature 101 to complete a die bonded structure 200 as shown in FIG. 4. In some embodiments, the carrier substrate 201 includes a glass substrate, a flexible plastic substrate, a printed circuit board, or other device substrates of applicable electronic products. In addition, the plurality of dies 107 may be bonded to the carrier substrate 201 through solder features 202. The solder features 202 are disposed between the carrier substrate 201 and a first surface of the die 107 facing the carrier substrate 201. In some embodiments, the solder features 202 include solder balls or solder bumps, and the solder features 202 are bonded to the conductive pads 115 of the die 107.

As shown in FIG. 4, according to some embodiments of the present disclosure, after the dies are transferred, the die bonded structure 200 includes a portion of the oxide layer supporting feature 101 (such as the die setting region 101A, which may also be referred to as an oxide layer) disposed on a second surface of the die 107 away from the carrier substrate 201. In addition, while viewed in a top view, a portion of the oxide layer laterally protrudes from the die 107, so that the area of the oxide layer is larger than the area of the die 107 in a top view. Moreover, the die bonded structure 200 further includes a protective layer 120 covering the side surfaces and the first surface of the die 107, and covering the surface of the portion of the oxide layer laterally protruding from the die 107. According to the embodiments of the present disclosure, after the dies are transferred, the oxide layer included in the die bonded structure 200 protects the second surface (or referred to as the backside) of the die 107, and the protective layer 120 included in the die bonded structure 200 protects the side surfaces and the first surface (or referred to as the front surface) of the die 107. Therefore, the die bonded structure 200 of the embodiments of the present disclosure prevents the moisture and oxygen in the external environment from penetrating into the die 107, and the reliability of electronic products is improved.

Figure 5:
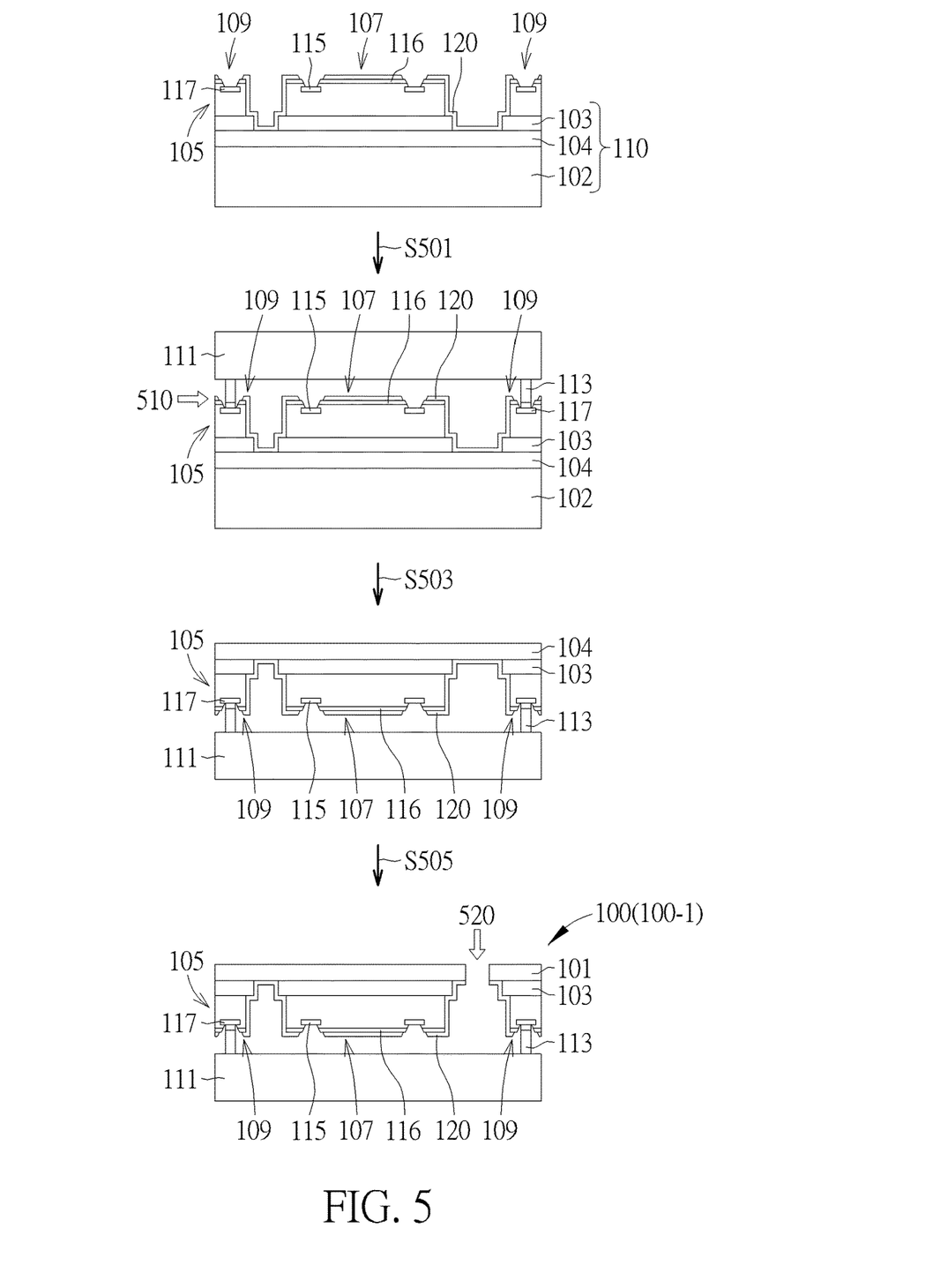
FIG. 5 shows schematic cross-sectional diagrams of structures at some stages of a method of transferring dies according to another embodiment of the present disclosure.

FIG. 5 shows schematic cross-sectional diagrams of structures at some stages of a method of transferring dies and a die bonded structure after the dies are transferred according to another embodiment of the present disclosure. Referring to FIG. 5, first, an SOI substrate 101 is provided, and a die 107 and a bonding feature 109 are formed on the oxide layer 104 of the SOI substrate 101 and are separated from each other. The details the structure may refer to the aforementioned description of the FIG. 4, and will not be repeated here. Next, as shown in FIG. 5, at step S501, a supporting wafer 111 is provided, and spacers 113 are formed on the supporting wafer 111. Then, a bonding process 510 is performed to bond the supporting wafer 111 to the bonding pads 117 of the bonding feature 109 through the spacers 113, where the supporting wafer 111 is separated from the die 107 and the bonding feature 109 by a gap. In this embodiment, the bonding process 510 may be performed through the glue of the spacer 113.

Thereafter, as shown in FIG. 5, at step S503, the structure of the step S501 is turned upside down, and the semiconductor substrate 102 of the SOI substrate 110 may be completely removed to expose the oxide layer 104. Next, as shown in FIG. 5, at step S505, an etching process 520 is performed on the exposed oxide layer 104 and the protective layer 120 thereunder, so that the protective layer 120 and the oxide layer 104 in the die setting region 101A of one repeating unit are separated from the protective layer 120 and the oxide layer 104 in the peripheral region 101B of another adjacent repeating unit to form an oxide layer supporting feature 101, and the structure 100-1 of transferring dies of FIG. 1 is completed. Afterwards, the process steps S407, S409 and S411 as shown in FIG. 4 are performed, using the transfer equipment 330 to release a large number of dies 107 from the structure 100-1 of transferring dies and to transfer the dies 107 onto the carrier substrate 201 to complete the fabrication of the die bonded structure 200.

The difference between the embodiments of FIG. 5 and FIG. 4 is that in the method of transferring dies of the embodiment of FIG. 5, the etching process 520 of the oxide layer 104 is performed after the bonding process 510 of the supporting wafer 111 and after the removal of the semiconductor substrate 102. In the method of transferring dies of the embodiment of FIG. 4, the etching process 410 of the oxide layer 104 is performed before the bonding process 420 of the supporting wafer 111.

Figure 6:
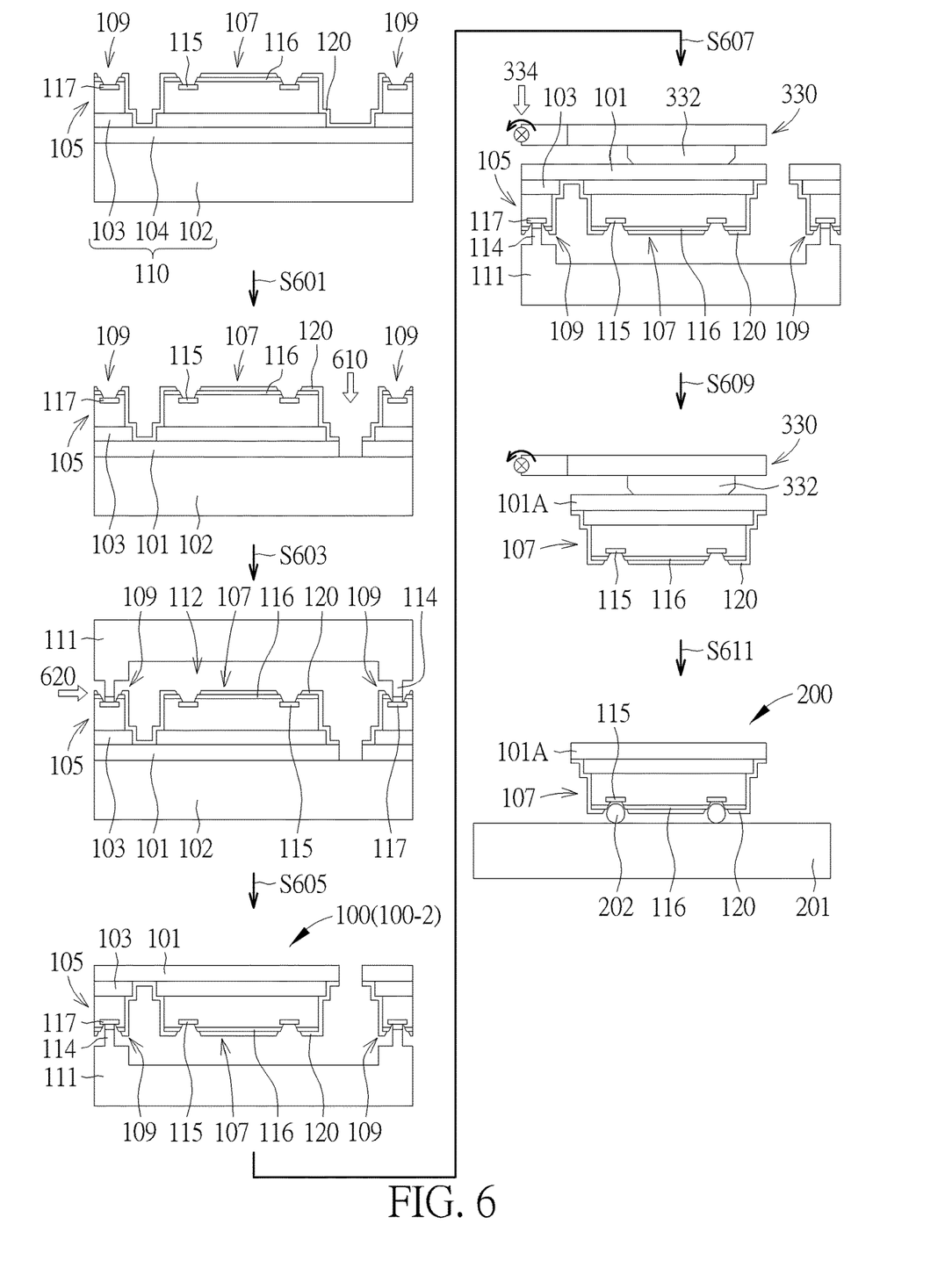
FIG. 6 shows schematic cross-sectional diagrams of structures at several stages of a method of transferring dies and a die bonded structure after the dies are transferred according to another embodiment of the present disclosure.

FIG. 6 shows schematic cross-sectional diagrams of structures at several stages of a method of transferring dies and a die bonded structure after the dies are transferred according to another embodiment of the present disclosure. Referring to FIG. 6, first, an SOI substrate 101 is provided, and a die 107 and a bonding feature 109 are formed on the oxide layer 104 of the SOI substrate 101 and are separated from each other. The details of the structure may refer to the aforementioned description of FIG. 4, and will not be repeated here. Next, referring to FIG. 6, at step S601, an etching process 610 is performed on the oxide layer 104 and the protective layer 120 to form an oxide layer supporting feature 101. The details of the structure may refer to the aforementioned description of the step S401 of FIG. 4, and will not be repeated here.

Then, as shown in FIG. 6, at step S603, a supporting wafer 111 is provided, and the supporting wafer 111 is etched by an etching process to form a cavity 112 and a stand-off of a spacer 114. Then, an eutectic bonding bump is formed on the stand-off of the spacer 114 for bonding the supporting wafer 111 and the spacer 114 to the bonding pads 117 of the bonding feature 109 through a bonding process 620, where the position of the die 107 corresponding to the cavity 112 of the supporting wafer 111 provides a larger space for accommodating the die 107. In this embodiment, the bonding process 620 may be performed by eutectic bonding through the eutectic bonding bump of the spacer 114.

Next, as shown in FIG. 6, at step S605, the structure of the step S603 is turned upside down, and the semiconductor substrate 102 of the SOI substrate 110 may be completely removed to expose the oxide layer supporting feature 101. Then, the structure 100-2 of transferring dies as shown in FIG. 1 is formed.

Thereafter, as shown in steps S607, S609 and S611 of FIG. 6, a large number of dies 107 are released from the structure 100-2 of transferring dies by using the transfer equipment 330. Then, the dies are transferred onto the carrier substrate 201 to complete the die bonded structure 200 as shown in FIG. 6. The details of the steps S607, S609 and S611 of FIG. 6 may refer to the aforementioned descriptions of the steps S407, S409 and S411 of FIG. 4, and will not be repeated here.

The difference between the embodiments of FIG. 6 and FIG. 5 is that in the method of transferring dies of the embodiment of FIG. 6, the cavity 112 and the stand-off of the spacer 114 are formed in the supporting wafer 111, and the bonding process is performed through the eutectic bonding bump of the spacer 114.

Figure 7:
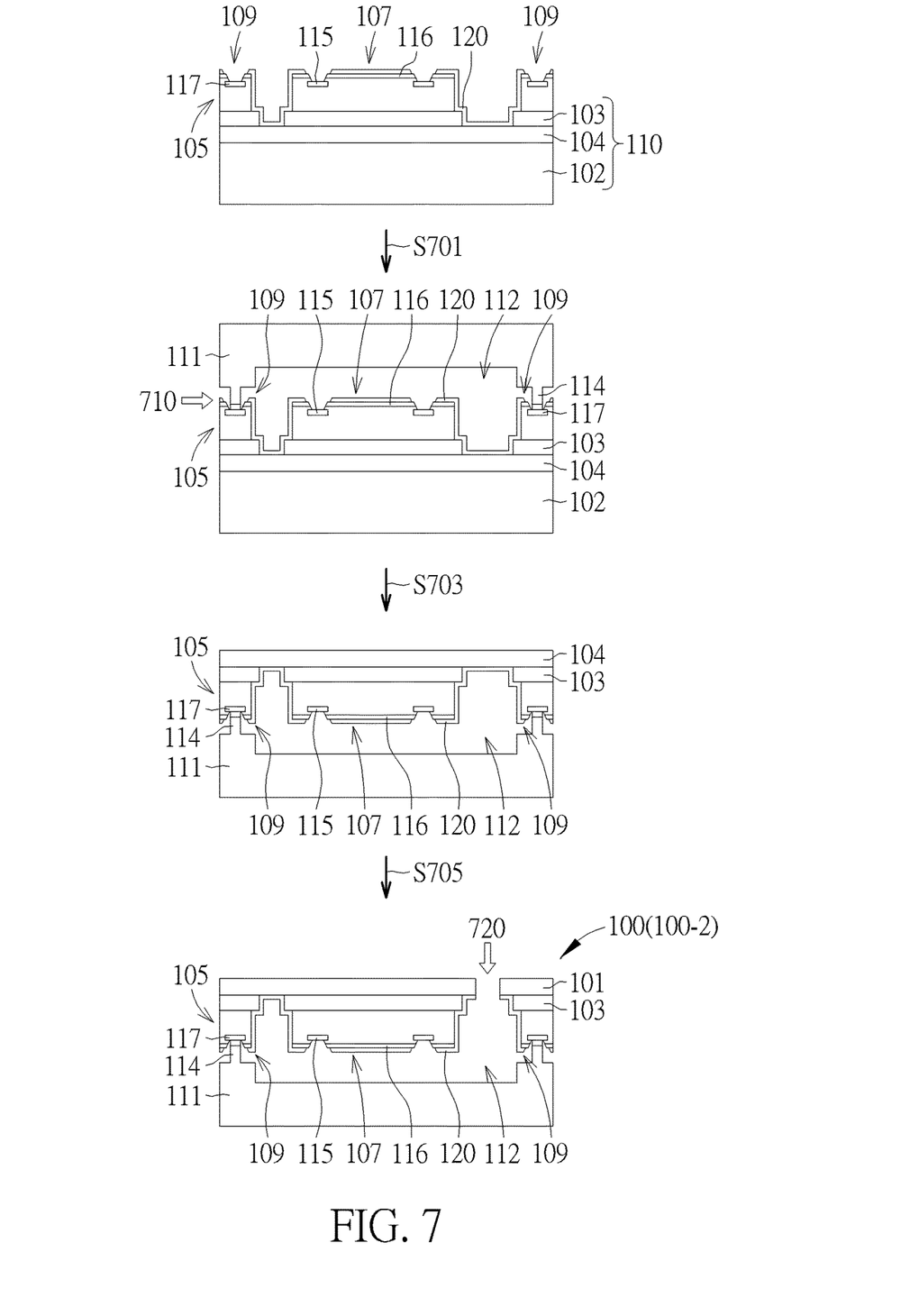
FIG. 7 shows schematic cross-sectional diagrams of structures at some stages of a method of transferring dies according to another embodiment of the present disclosure.

FIG. 7 shows schematic cross-sectional diagrams of structures at some stages of a method of transferring dies according to another embodiment of the present disclosure. Referring to FIG. 7, first, an SOI substrate 101 is provided, and a die 107 and a bonding feature 109 are formed on the oxide layer 104 of the SOI substrate 101 and are separated from each other. The details of the structure may refer to the aforementioned description of FIG. 4, and will not be repeated here. Next, as shown in FIG. 7, at step S701, a supporting wafer 111 is provided, and the supporting wafer 111 is etched by an etching process to form a cavity 112 and a stand-off of a spacer 114. Then, an eutectic bonding bump is formed on the stand-off of the spacer 114 for bonding the supporting wafer 111 and the spacer 114 to the bonding pads 117 of the bonding feature 109 through a bonding process 710, where the position of the die 107 corresponding to the cavity 112 of the supporting wafer 111 provides a larger space for accommodating the die 107. In this embodiment, the bonding process 710 may be performed by eutectic bonding through the eutectic bonding bump of the spacer 114.

Then, as shown in FIG. 7, at step S703, the structure of the step S701 is turned upside down, and the semiconductor substrate 102 of the SOI substrate 110 may be completely removed to expose the oxide layer 104 of the SOI substrate 110. Next, as shown in FIG. 7, at step S705, an etching process 720 is performed on the exposed oxide layer 104 and the protective layer 120 thereunder, so that the protective layer 120 and the oxide layer 104 in the die setting region 101A of one repeating unit are separated from the protective layer 120 and the oxide layer 104 in the peripheral region 101B of another adjacent repeating unit to form an oxide layer supporting feature 101. Then, the structure 100-2 of transferring die as shown in FIG. 1 is completed. Afterwards, the process steps shown in the steps S607, S609 and S611 of FIG. 6 are performed by using the transfer equipment 330 to release a large number of dies 107 from the structure 100-2 of transferring die, and to transfer the dies onto the carrier substrate 201. Then, the fabrication of the die bonded structure 200 is completed.

The difference between the embodiments of FIG. 7 and FIG. 6 is that in the method of transferring dies of the embodiment of FIG. 7, the etching process 720 of the oxide layer 104 is performed after the bonding process 710 of the supporting wafer 111 and after the removal of the semiconductor substrate 102. In the method of transferring dies of the embodiment of FIG. 6, the etching process 610 of the oxide layer 104 is performed before the bonding process 620 of the supporting wafer 111.

Figure 8:
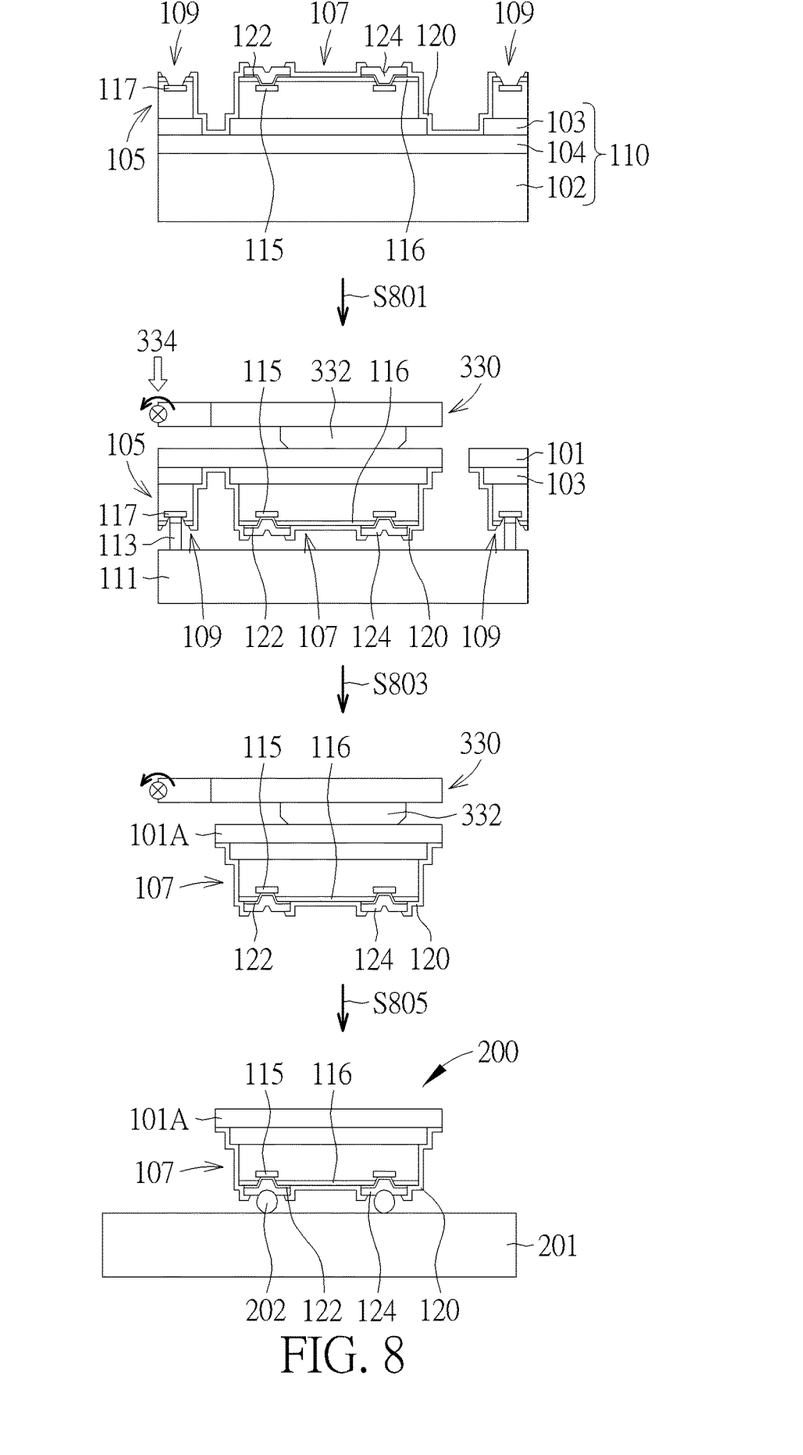
FIG. 8 shows schematic cross-sectional diagrams of structures at some stages of a method of transferring dies and a die bonded structure after the dies are transferred according to another embodiment of the present disclosure.

FIG. 8 shows schematic cross-sectional diagrams of structures at some stages of a method of transferring dies and a die bonded structure after the dies are transferred according to another embodiment of the present disclosure. Referring to FIG. 8, first, according to some embodiments, an SOI substrate 101 is provided, and a die 107 and a bonding feature 109 are formed on the oxide layer 104 of the SOI substrate 101 and are separated from each other. The details of the structure may refer to the aforementioned description of FIG. 4, and will not be repeated here. The structure of the embodiment of FIG. 8 may be used to replace the structures of the embodiments of FIG. 4, FIG. 5, FIG. 6, and FIG. 7 to complete the structures 100-3 and 100-4 of transferring dies as shown in FIG. 2. The difference between the embodiment of FIG. 8 and the embodiments of FIG. 4, FIG. 5, FIG. 6, and FIG. 7 is that there are an under bump metallurgy (UBM) 122 and a metal bump 124 disposed on the conductive pad 115 of the die 107 in the embodiment of FIG. 8. Next, the process steps as shown in the steps S401, S403 and S405 of FIG. 4, or as shown in the steps S501, S503 and S505 of FIG. 5, or as shown in the steps S601, S603 and S605 of FIG. 6, or as shown in the steps S701, S703 and S705 of FIG. 7 are performed to form the structure 100-3 or 100-4 of transferring dies as shown in FIG. 2.

Thereafter, as shown in steps S801, S803 and S805 of FIG. 8, in some embodiments, a large number of dies 107 are released from the structure 100-3 of transferring dies by using the transfer equipment 330, and then the dies are transferred onto the carrier substrate 201 to complete the die bonded structure 200 as shown in FIG. 8. Similarly, a large number of dies 107 in the structure 100-4 of transferring dies as shown in FIG. 2 may be transferred by the process steps S801, S803 and S805 as shown in FIG. 8 to complete the die bonded structure 200 as shown in FIG. 8.

Figure 9:
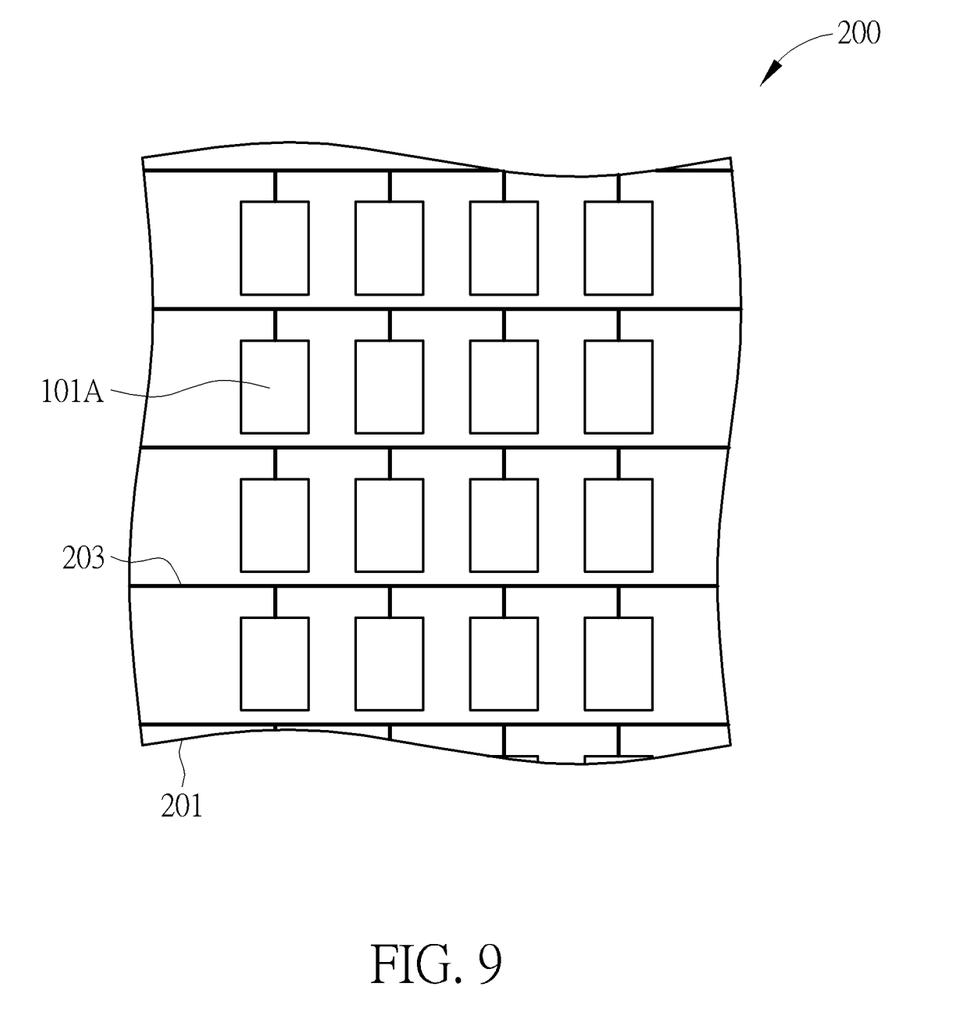
FIG. 9 is a top view of a die bonded structure after the dies are transferred according to some embodiments of the present disclosure.

FIG. 9 is a top view of a die bonded structure 200 after the dies are transferred according to some embodiments of the present disclosure. In order to make the diagram be concise and easy to understand, FIG. 9 only depicts an oxide layer of the die bonded structure 200, such as the die setting region 101A of the oxide layer supporting feature 101, a carrier substrate 201, and multiple wires 203 on the carrier substrate 201, where the position of the die setting regions 101A of the oxide layer supporting feature 101 is the position of the transferred dies. These dies are electrically connected to the wires 203 on the carrier substrate 201, respectively. In some embodiments, the wires 203 are, for example, signal wires, and the signal of the dies may be transmitted to other devices of an electronic product, or the signal of a peripheral circuit of the electronic product may be transmitted to the dies through the wires 203.

According to the embodiments of the present disclosure, in a mass transfer of dies, the number of dies per unit area is increased, thereby improving the efficiency of transferring dies. Meanwhile, in the die bonded structure after the dies are transferred, the front and side surfaces of the dies are covered by a protective layer and the back surface of the dies is also covered by an oxide layer to prevent moisture and oxygen from penetrating into the dies, thereby improving the reliability of electronic products using these dies.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A structure of transferring dies, comprising:
   an oxide layer supporting feature, including a plurality of repeating units, wherein each of the repeating units includes a die setting region and a peripheral region, and the die setting region of one repeating unit is separated from the peripheral region of another adjacent repeating unit;
   a plurality of dies, respectively disposed on the die setting regions but not disposed on the peripheral region of the oxide layer supporting feature;
   a bonding feature, disposed on the peripheral region of the oxide layer supporting feature;
   a supporting wafer, disposed under the oxide layer supporting feature and separated from the dies and the bonding feature by a gap; and
   a spacer, disposed between the bonding feature and the supporting wafer, wherein the spacer is bonded to the bonding feature, and comprises a glue bond dam or an eutectic bond bump.

2. The structure of transferring dies of claim 1, wherein the bonding feature is separated from the die, and the bonding feature and the die have a same semiconductor layer and a same interconnect structure layer.

3. The structure of transferring dies of claim 1, wherein the bonding feature comprises a bonding pad, and the glue bond dam or the eutectic bond bump is bonded to the bonding pad.

4. The structure of transferring dies of claim 1, wherein the die comprises a plurality of conductive pads, or the die comprises a plurality of conductive pads, and an under bump metallurgy and a metal bump disposed on the conductive pad.

5. The structure of transferring dies of claim 1, wherein the supporting wafer comprises a cavity corresponding to the die, and the distance between the die and a bottom surface of the cavity of the supporting wafer is greater than the distance between the bonding feature and a surface of the supporting wafer.

6. The structure of transferring dies of claim 1, wherein a thinned configuration is provided at an interface between the peripheral region and the die setting region, and the peripheral region is separated from the die setting region of the same repeating unit of the oxide layer supporting feature when transferring the dies.

7. The structure of transferring dies of claim 1, further comprising a protective layer covering the dies, the bonding feature, and a surface of the oxide layer supporting feature exposed between the die and the bonding feature, wherein the protective layer includes a plurality of openings to expose a plurality of conductive pads or a plurality of metal bumps of the dies, and a bonding pad of the bonding feature.

\* \* \* \* \*